US011486782B2

(12) United States Patent
Heuck et al.

(10) Patent No.: US 11,486,782 B2
(45) Date of Patent: Nov. 1, 2022

(54) MICROMECHANICAL DEVICE AND METHOD FOR MANUFACTURING A MICROMECHANICAL DEVICE

(71) Applicant: Robert Bosch GmbH, Stuttgart (DE)

(72) Inventors: Friedjof Heuck, Stuttgart (DE); Mike Schwarz, Kusterdingen (DE); Thomas Friedrich, Moessingen-Oeschingen (DE); Volkmar Senz, Metzingen (DE)

(73) Assignee: Robert Bosch GmbH, Stuttgart (DE)

( * ) Notice: Subject to any disclaimer, the term of this patent is extended or adjusted under 35 U.S.C. 154(b) by 353 days.

(21) Appl. No.: 16/633,266

(22) PCT Filed: Jul. 16, 2018

(86) PCT No.: PCT/EP2018/069191
§ 371 (c)(1),
(2) Date: Mar. 11, 2020

(87) PCT Pub. No.: WO2019/020409
PCT Pub. Date: Jan. 31, 2019

(65) Prior Publication Data
US 2021/0131897 A1    May 6, 2021

(30) Foreign Application Priority Data
Jul. 26, 2017    (DE) .................... 10 2017 212 875.5

(51) Int. Cl.
*G01L 19/06* (2006.01)
*B81B 3/00* (2006.01)
*G01L 9/00* (2006.01)
*B81B 7/00* (2006.01)
*G01R 27/26* (2006.01)
*G01L 19/14* (2006.01)
*G01N 27/12* (2006.01)
*G01N 33/18* (2006.01)
(Continued)

(52) U.S. Cl.
CPC .......... *G01L 9/0073* (2013.01); *B81B 3/0051* (2013.01); *B81B 7/0016* (2013.01);
(Continued)

(58) Field of Classification Search
None
See application file for complete search history.

(56) References Cited

U.S. PATENT DOCUMENTS 9,233,834 B2 *  1/2016 Faralli .................. B81B 3/0021
9,604,840 B1 *  3/2017 Cheng ................. B81C 1/00238
(Continued)

FOREIGN PATENT DOCUMENTS

CN    1750260 A    3/2006
CN    1900692 A    1/2007
(Continued)

OTHER PUBLICATIONS

International Search Report dated Dec. 10, 2018 for corresponding International Application PCT/EP2018/069191, filed Jul. 16, 2018.

*Primary Examiner* — Herbert K Roberts
(74) *Attorney, Agent, or Firm* — Norton Rose Fulbright US LLP; Gerard Messina

(57) ABSTRACT

A micromechanical device that includes a carrier substrate; a sensor device that is situated on the carrier substrate and spaced apart from a surface section of the carrier substrate with the aid of spring elements in such a way that the sensor device is oscillatable relative to the surface section; and at least one stopper element, situated on the sensor device and/or on the surface section of the carrier substrate, which limits a deflection of the sensor device in the direction of the surface section.

9 Claims, 3 Drawing Sheets

(51) Int. Cl.
*G01N 27/04* (2006.01)
*G01N 27/22* (2006.01)

(52) U.S. Cl.
CPC ...... *G01L 19/0618* (2013.01); *G01L 19/0654* (2013.01); *G01L 19/146* (2013.01); *G01R 27/2605* (2013.01); *B81B 2201/0264* (2013.01); *B81B 2203/0163* (2013.01); *G01N 27/048* (2013.01); *G01N 27/223* (2013.01); *G01N 2291/02845* (2013.01)

(56) References Cited

U.S. PATENT DOCUMENTS

| | | | |
|---|---|---|---|
| 9,926,192 B2* | 3/2018 | Zhang | H01L 21/76838 |
| 2013/0180332 A1 | 7/2013 | Jia et al. | |
| 2015/0241216 A1* | 8/2015 | Ahtee | G01C 19/5712 73/504.12 |
| 2016/0327446 A1* | 11/2016 | Classen | B81B 7/0048 |
| 2017/0144881 A1* | 5/2017 | Baldo | B81B 3/0072 |
| 2018/0312396 A1* | 11/2018 | Lee | B81C 1/00285 |

FOREIGN PATENT DOCUMENTS

| | | |
|---|---|---|
| CN | 101087999 A | 12/2007 |
| CN | 101628704 A | 1/2010 |
| CN | 102435773 A | 5/2012 |
| CN | 103792267 A | 5/2014 |
| CN | 105731359 A | 7/2016 |
| CN | 105829850 A | 8/2016 |
| DE | 102010031197 | 1/2012 |
| WO | 2007136523 A2 | 11/2007 |

* cited by examiner

MICROMECHANICAL DEVICE AND METHOD FOR MANUFACTURING A MICROMECHANICAL DEVICE

FIELD OF THE INVENTION

The present invention relates to a micromechanical device that may be used for measuring a physical variable such as an ambient pressure. Moreover, the present invention relates to a method for manufacturing a micromechanical device.

BACKGROUND INFORMATION

Micromechanical pressure sensors are used for ascertaining pressure and mechanical stresses in portable devices, and also in industrial and household apparatuses. One example of a pressure sensor is discussed in German patent document DE 10 2010 031197 A1. However, the sensors not only register external pressure fluctuations, but are also sensitive to vibrations of the housing. However, it is often desirable to eliminate or at least reduce the effect of these vibrations.

SUMMARY OF THE INVENTION

The present invention provides a micromechanical device having the features described herein, and a method for manufacturing a micromechanical device having the features described herein.

Accordingly, according to a first aspect, the present invention relates to a micromechanical device that includes a carrier substrate, and a sensor device that is spaced apart from a surface section of the carrier substrate and fastened to the carrier substrate with the aid of spring elements. The sensor device thus has a configuration that is oscillatable relative to the surface section. At least one stopper element that limits a deflection of the sensor device in the direction of the surface section is situated on the sensor device and/or on the surface section of the carrier substrate.

According to a second aspect, the present invention relates to a method for manufacturing a micromechanical device. An integrated circuit and a MEMS structure are provided, the MEMS structure including a sensor device that is oscillatably situated with the aid of spring elements. At least one stopper element is situated on the sensor device and/or on a surface section of the integrated circuit. The MEMS structure is connected to the integrated circuit in such a way that the sensor device is oscillatable relative to the surface section of the integrated circuit, and a deflection of the sensor device in the direction of the surface section being limited by the at least one stopper element.

Specific embodiments are the subject matter of the respective further descriptions herein.

The micromechanical device according to the present invention allows a certain decoupling of the sensor device from the carrier substrate due to the suspension via spring elements. To ensure sufficiently good decoupling, the spring elements must also be flexible enough to deflect the sensor device in the event of external vibrations, thus compensating for the undesirable cross-influences. Nevertheless, according to the present invention it is possible to prevent damage to the sensor device or other components situated on the carrier substrate. Stopper elements that limit the oscillation or deflection of the sensor device are provided for this purpose. The stopper elements are thus used as setpoint contact points to prevent direct contact of the sensor device with the surface section of the carrier substrate, or even rupture of the spring elements due to overload. Possible abrasion and chipping off of particles during a collision of the sensor device with the surface section may thus be prevented.

According to one refinement of the device, a first stopper element is situated on the sensor device, and a second stopper element is situated on the surface section. The sensor device may thus be deflected only until the first stopper element touches the second stopper element. The distance between the first stopper element and the second stopper element at any time is smaller than the distance between an area of the sensor device and an oppositely situated area of the surface section of the carrier substrate. This ensures that only the stopper elements may make contact.

According to one refinement of the device, the first stopper element includes a first electrode and the second stopper element includes a second electrode. The device also includes an evaluation device that measures a capacitance between the first electrode and the second electrode. The evaluation device determines a level of moisture in the area between the sensor device and the surface section, taking the measured capacitance into account. This is based on the physical principle that a change in the moisture in the air, present as a dielectric between the first electrode and the second electrode, results in a change in the relative permittivity. For example, the relative permittivity of air in the absence of water is 1.0059, while in the saturated state the relative permittivity is 1.77. This results in a change in the capacitance between the two electrodes. The moisture may thus be determined by measuring the capacitance. A relationship between the capacitance and the moisture may be empirically ascertained and stored in a table.

According to one refinement of the device, a reference electrode is situated on the surface section, and a second reference electrode is situated on a region of the carrier substrate that is spaced apart from the surface section and adjacent to the sensor device. The distance between the region and the surface section is fixed. For example, the reference electrodes are situated at areas of the surface section or the region that are spatially fixed with respect to one another. The evaluation device is also configured to measure a reference capacitance between the first and second reference electrodes, and also to determine the moisture, taking the reference capacitance into account. Since the reference capacitance is measured between two spatially fixed reference electrodes, the reference capacitance is not a function of a vibration of the carrier substrate. By comparing the time curve of the measured capacitance to the time curve of the measured reference capacitance, it may be ascertained whether a change in capacitance is caused by a change in the moisture or by a vibration of the carrier substrate. The effect of external vibrations or movements of the carrier substrate may thus be taken into account in computing the moisture, and eliminated. According to another specific embodiment, the reference capacitance may also be directly measured and used for computing the moisture.

According to one refinement of the device, the evaluation device is configured to measure a resonant frequency of an oscillation of the sensor device relative to the surface section and to determine the moisture, taking the resonant frequency into account. The moisture has an effect on the quality of the oscillation system, and thus, on the resonant frequency. The moisture may be ascertained directly, based on the resonant frequency, by empirically ascertaining the relationship between resonant frequency and moisture, which may be stored in a table, for example.

According to one refinement of the device, the hardness of an impact surface of the first stopper element differs from the hardness of an impact surface of the second stopper element. The impact surfaces are understood to mean those areas in which the stopper elements contact one another. Such a material selection may reduce the effects of an impact, since the softer stopper element with the lesser hardness can better absorb the energy.

The hardness of the impact surface of the second stopper element may be less than the hardness of the impact surface of the first stopper element. Even if cracks and damage occur during a collision of the stopper elements, this is usually the case only for the second stopper element with the lesser hardness. However, the first stopper element connected to the sensor device is protected, so that damage to the more sensitive sensor device is prevented. For example, the impact surface of the first stopper element may be made of a softer, more metallic layer, such as an aluminum-copper (AlCu) layer, while the impact surface of the second stopper element is made of a harder passivation layer, such as a nitride layer.

According to one refinement, a surface of the sensor device facing the surface section of the carrier includes a passivation layer. For example, a nitride layer may be formed on this surface. The first stopper element is formed at or on this surface, the passivation layer being interrupted in an area around the first stopper element. The passivation layer is thus removed in this area, or a passivation layer is not formed at all. When the stopper elements collide, cracks may form which may develop, for example, in a passivation layer that is formed on a surface of the first stopper element. However, since the passivation layer is interrupted around the first stopper element, these cracks cannot propagate further, so that the sensor device is better protected from damage. In particular, a change in the measuring conditions of the sensor element due to liquid penetrating into cracks is prevented, since this does not occur at all in the area of the signal converter.

According to one refinement of the device, the evaluation device is also configured to measure an ambient pressure, based on a measuring signal of the sensor device and taking the ascertained moisture into account. Since the electrodes are provided in or on the stopper elements, the moisture in the immediate surroundings of the sensor device is determined.

According to one specific embodiment of the device, the evaluation device is also configured to compute an acceleration of the sensor element in the direction of the surface section of the carrier substrate, taking into account the ascertained capacitance, and which may also take into account the ascertained reference capacitance. In particular, the evaluation device may compare a change in the capacitance to a change in the reference capacitance. Since the reference electrodes are spatially fixed with respect to one another, the change in the reference capacitance is essentially independent of the acceleration of the sensor element, and is a function only of a change in other external parameters, such as the moisture in the air. The evaluation device may correct the measured change in the capacitance based on the measured change in the reference capacitance. The corrected change in the capacitance is then a function only of the acceleration of the sensor element in the direction of the surface section of the carrier substrate. This allows the evaluation device to ascertain the acceleration of the sensor element.

According to one refinement of the device, the carrier substrate includes an integrated circuit that includes the surface section. In addition, the carrier substrate includes a MEMS structure at or on which the integrated circuit is situated. The sensor device is situated in a recess of the MEMS structure, and is connected to the MEMS structure via the spring elements.

According to one refinement of the device, the sensor device includes a cavity, and a diaphragm that spans the cavity. The sensor device is thus configured as a pressure sensor device.

Identical or functionally equivalent elements and devices are provided with the same reference numerals in all figures. The numbering of method steps is used for clarity, and generally is not to be construed as a specific chronological sequence. In particular, multiple method steps may also be carried out concurrently.

DETAILED DESCRIPTION

Figure 1:
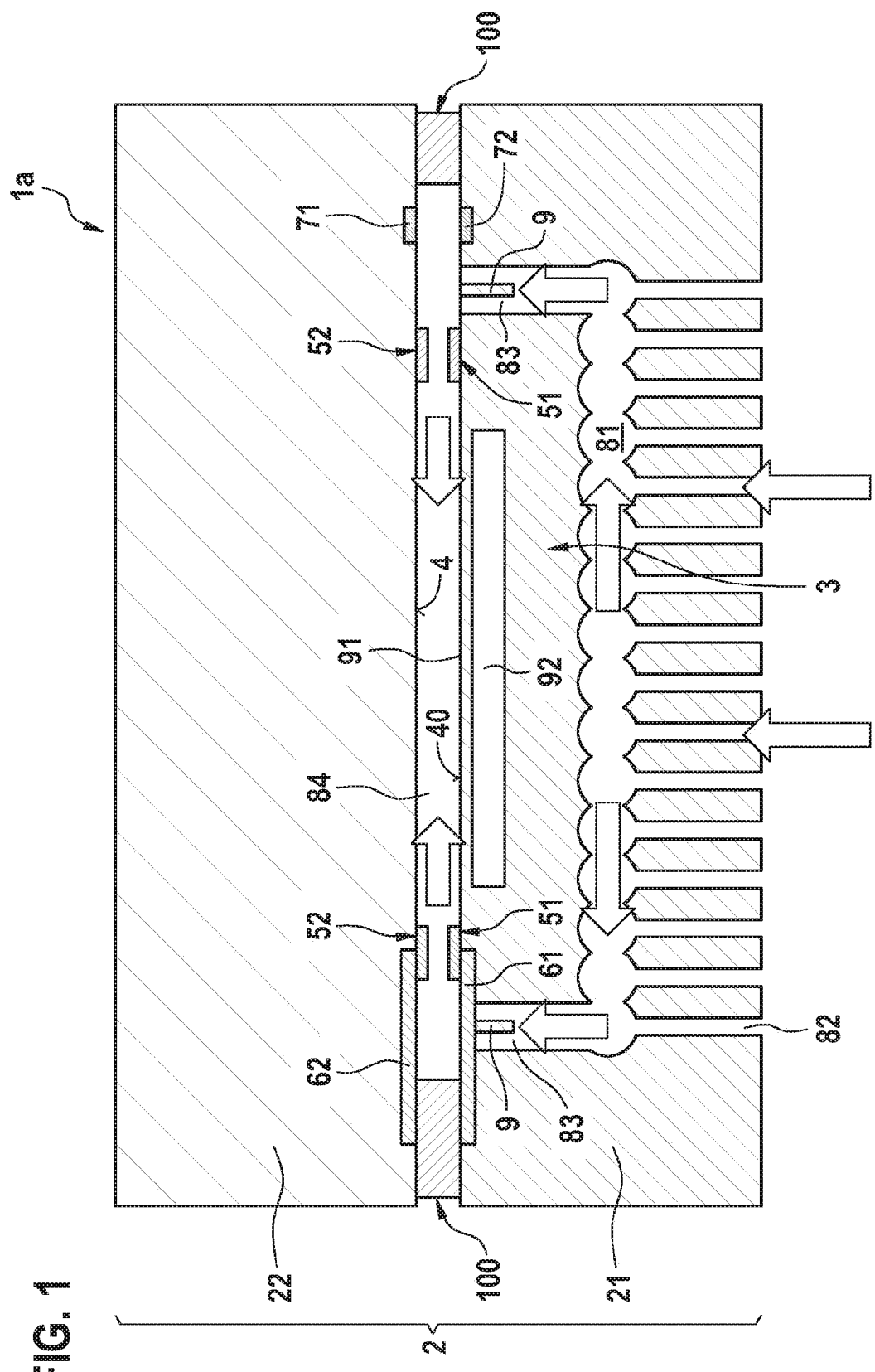
FIG. 1 shows a schematic cross-sectional view of a micromechanical device according to one specific embodiment of the present invention.

FIG. 1 shows a schematic cross-sectional view of a micromechanical device 1a according to one specific embodiment of the present invention. Micromechanical device 1a includes a carrier substrate 2 that is made up of a MEMS structure 21 and an integrated circuit or an ASIC 22 that are connected to one another via bond connections 100, using eutectic alloys. A measuring channel 84 extends between MEMS structure 21 and integrated circuit 22.

MEMS structure 21 includes a sensor device 3 that may be used for measuring a pressure in measuring channel 84. For this purpose, sensor device 3 includes a diaphragm 91 that closes off a cavity 92, formed in a substrate of sensor device 3, in an airtight manner. A reference gas having a reference pressure is situated in cavity 92. Mechanical stresses or changes in the pressure in measuring channel 84 relative to the reference pressure generate deflections or oscillations of diaphragm 91, which may be detected via known measuring elements, for example piezoelements. A corresponding electrical signal is relayed to an evaluation device (not shown), which uses the electrical signal for measuring the ambient pressure or the mechanical stress.

Sensor device 3 is fastened to the surrounding substrate with the aid of spring elements 9. The sides of sensor device 3 pointing away from integrated circuit 22 are isolated from the surrounding substrate by appropriate air channels 81, 83. For this purpose, a hole pattern is created on the rear side with the aid of photolithography, and anisotropic etching is used to form trenches 82 that end in bulk silicon. By excluding the passivation and sputtering portions in the DRIE etching process, a cavity or an air channel 81 that separates the rear side of the sensor device 3 from the surrounding substrate is formed with the aid of subsequent isotropic etching at the end of trenches 82. Lateral air channels 83 are formed by creating trenches on the front side, leaving webs. The webs are reshaped to form spring elements 9 by exposure on the rear side, so that sensor element 3 is connected to the surrounding carrier substrate solely by spring elements 9. Sensor device 3 is thus oscillatably suspended, so that possible vibrations of the carrier substrate and external stress, for example due to the package, may be compensated for by spring elements 9.

Measuring channel 84 is in fluidic connection with the surrounding air via air channels 81, 83, so that the ambient pressure may be determined by measuring the pressure in measuring channel 84.

Sensor device 3 may oscillate in particular in the normal direction, i.e., in the direction of a surface section 4 of integrated circuit 22. First stopper elements 51 and second stopper elements 52 are formed on oppositely situated sides of surface section 4 along the normal direction, and on an oppositely situated surface 40 of sensor device 3. When sensor device 3 is strongly deflected, a first stopper element 51 situated on surface 40 of sensor element 3 contacts oppositely situated second stopper element 52 formed on surface section 4 of integrated circuit 22.

In the specific embodiments shown in FIG. 1, two pairs of first and second stopper elements 51, 52 are formed in opposite edge regions of surface 40 of sensor device 3 to allow uniform contacting and to suppress the possible generation of torques. However, according to further specific embodiments, it is also possible to provide only a single pair of stopper elements 51, 52, or a plurality of pairs of stopper elements 51, 52 may also be provided.

Stopper elements 51, 52 include electrical lines or supply lines, or electrodes 61, 62 that may be situated on a surface of stopper elements 51, 52. Electrical lines 61, 62 are connected to one another via spring elements 9 and bond connections 100, and are appropriately routed to bond pads, which may be situated on MEMS structure 21 or on integrated circuit 22. An electrical signal is output to the evaluation device as a function of a capacitance between electrical lines 61, 62 or stopper elements 51, 52.

Reference electrodes 71, 72 are also provided, a first reference electrode 71 being formed at, inside, or on surface section 4 of integrated circuit 22, and a second reference electrode 72 extending in a section of MEMS structure 21 oppositely situated along the normal direction. An electrical signal is measured as a function of a reference capacitance between reference electrodes 71, 72, and is relayed to the evaluation device.

The evaluation device is configured to determine a level of moisture in the air between sensor device 3 and integrated circuit 22, based on the measured capacitance and the measured reference capacitance. For this purpose, either the capacitance and the reference capacitance themselves, or a change in the capacitance and the reference capacitance, may be evaluated. The magnitude and the change over time of the capacitance and the reference capacitance are a function of the moisture. A relationship between the corresponding values of the capacitance or reference capacitance and a variable for the moisture may be empirically determined. The evaluation device may ascertain the moisture based on a corresponding data table, with knowledge of the capacitance or reference capacitance. The reference capacitance may be used in particular to eliminate effects of external vibrations on the change in the capacitance. For example, if only the capacitance changes but the reference capacitance remains essentially constant, the evaluation device may recognize that the change in the capacitance results solely from a movement of the sensor device in the direction of surface section 4 of integrated circuit 22. In general, to compensate for such relative movements based, for example, on the appropriately weighted reference capacitance, the effect of these movements on the capacitance or on the change in the capacitance may be factored out in order to obtain a variable that may be used for computing the moisture.

The evaluation device may also be configured to ascertain a mass of the water in the air. For this purpose, the evaluation device estimates the mass of the water based on the ascertained moisture. The ascertained mass of the water is entered as a variable into a correction function for ascertaining the pressure. The correction function describes the effect of the mass of the water on the measured pressure. The correction of the pressure with the aid of the correction function may be carried out with the aid of a closed-loop process.

According to further specific embodiments, a comb electrode is formed in the area of first stopper element 51 and/or second stopper element 52. The change in capacitance of the comb electrode is influenced by the moisture in the air, so that the moisture in the air may be measured by measuring the capacitance or the change in capacitance.

Figure 2:
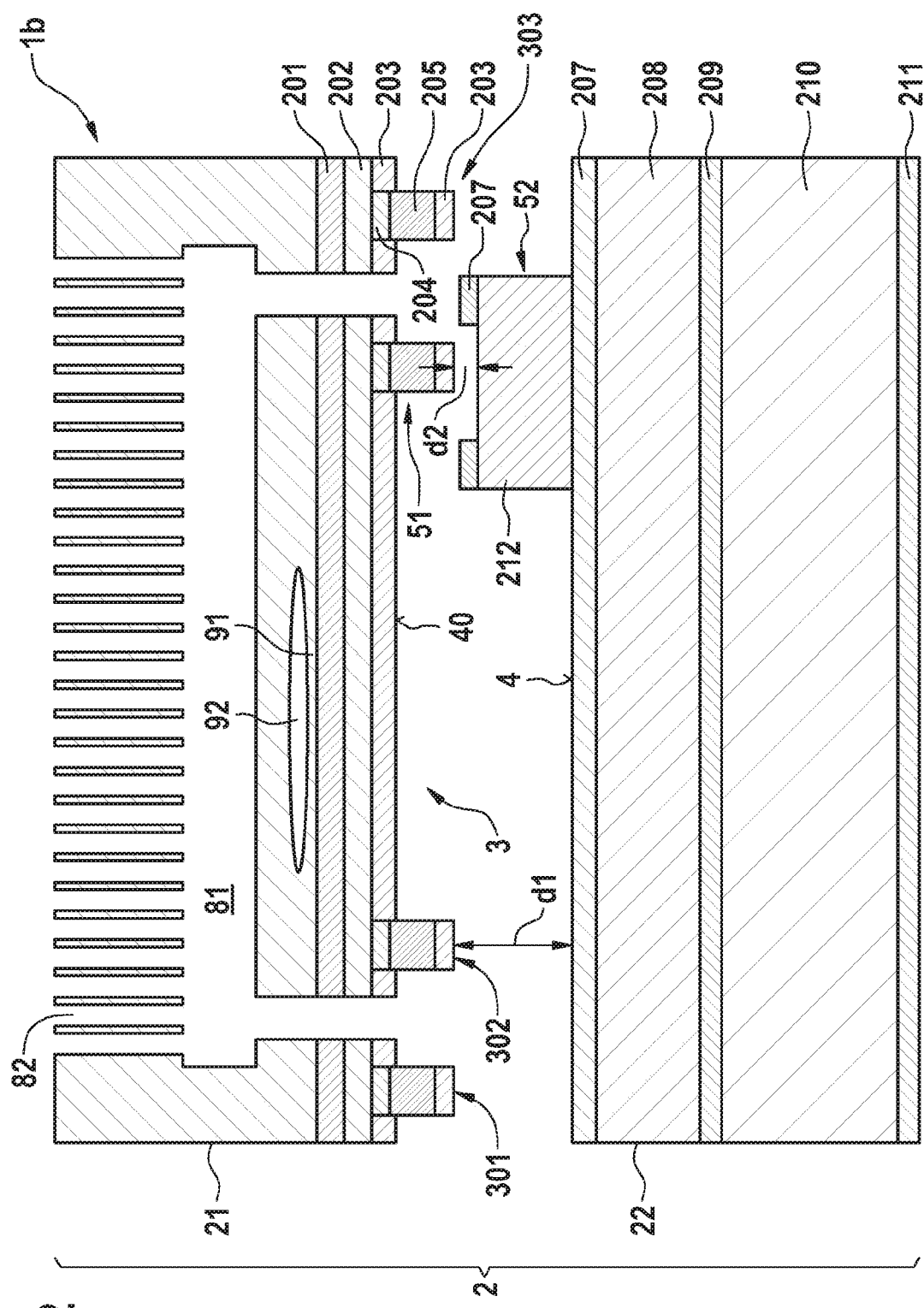
FIG. 2 shows a schematic cross-sectional view of a micromechanical device according to another specific embodiment of the present invention.

FIG. 2 illustrates a cross-sectional view of a micromechanical device 1b according to another specific embodiment of the present invention. The view that is shown is rotated by 180 degrees compared to FIG. 1. Device 1b corresponds essentially to device 1a described above, so that only the differences are addressed in greater detail. In particular, the layered structure of device 1b illustrated in FIG. 2 is described in greater detail below.

Accordingly, integrated circuit 22 includes oxide layers 208, 209, 211 and a silicon substrate 210 situated in between. Surface section 4 oppositely situated from MEMS substrate 21 includes a nitride layer as a passivation layer 207. Second stopper element 52 includes a layer 212 made of an aluminum-copper material that is at least partially coated with passivation layer 207. However, a central area of the surface of second stopper element 52, which is provided as a contact surface with first stopper element 51, is isolated from passivation layer 207.

MEMS substrate 21 is coated with oxide layers 201, 202 and an outer nitride layer as a passivation layer 203 on a side facing surface section 4 of integrated circuit 22.

Passivation layer 203 is interrupted in the area of first stopper element 51. First stopper element 51 includes a barrier layer 204 made of titanium nitride, and a metal-plated layer 205 made of an aluminum-copper material that is covered by passivation layer 203.

Further contacting elements 301, 302, 303 that are configured for electrically contacting diaphragm 91, for example, may be provided on surface 40 of sensor element 3. A minimum distance d1 between surface section 4 and sensor device 3 in the rest position may be approximately 1 to 2 microns, which may be 1.4 microns, and is greater than a minimum distance d2 between first stopper element 51 and second stopper element 52, which, for example is between 0.5 and 1 micron and may be 0.8 micron.

Figure 3:
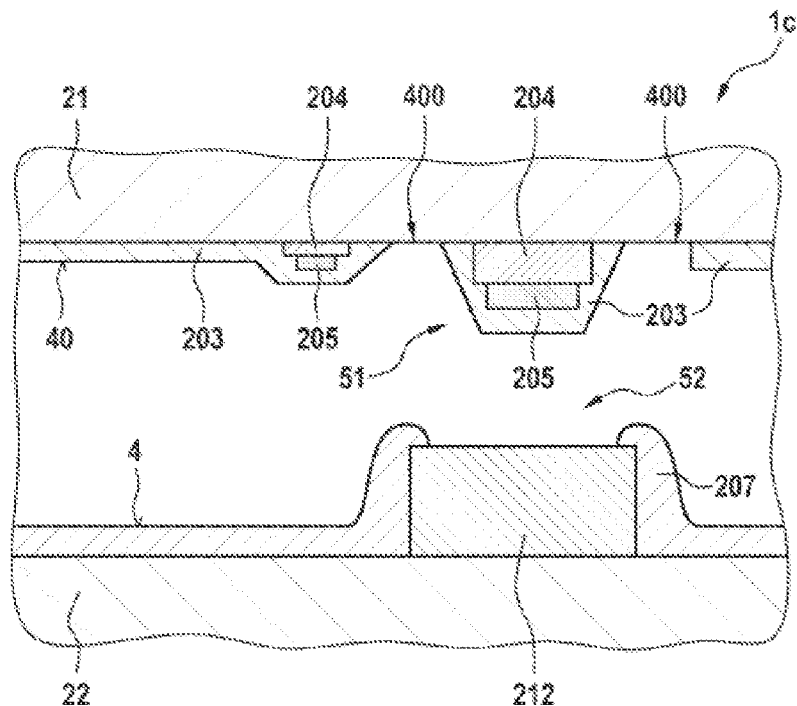
FIG. 3 shows a schematic cross-sectional view of a detail of a micromechanical device according to another specific embodiment of the present invention.

FIG. 3 illustrates a cross-sectional view of a detail of a device 1c according to another specific embodiment of the present invention. Device 1c may in other respects correspond to one of devices 1a, 1b described above. In the specific embodiment illustrated in FIG. 3, passivation layer 203, which covers surface 40 of sensor element 3 and barrier layer 204 as well as metal-plated layer 205 of first stopper element 51, is isolated in a circular ring-shaped region 400 around first stopper element 51.

Figure 4:
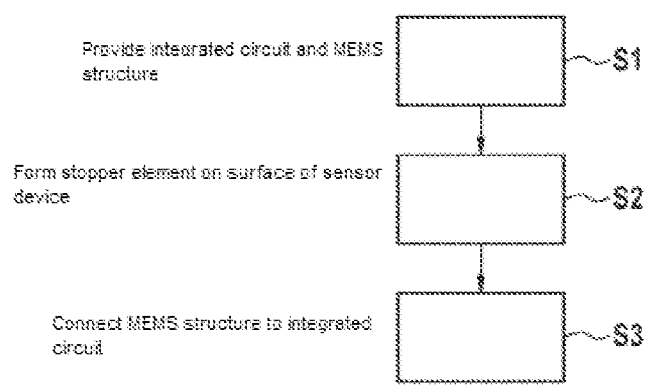
FIG. 4 shows a flow chart for explaining a method for manufacturing a micromechanical device according to one specific embodiment of the present invention.

FIG. 4 illustrates a flow chart for explaining a method for manufacturing a micromechanical device 1a, 1b, 1c.

An integrated circuit 22 and a MEMS structure 21 are provided in a first method step S1. The MEMS structure includes a sensor device that has an oscillatable configuration with the aid of spring elements. Sensor device 3 may thus be exposed by the etching on the rear side and front side described above, leaving spring elements 9. Sensor device 3 is thus oscillatably situated, and may oscillate in particular in a normal direction, i.e., perpendicular to the surface of sensor device 3.

Sensor device 3 may be configured as a pressure sensor, and may include a cavity 92 and a diaphragm 91 that spans cavity 92.

At least one first stopper element 51 is formed on a surface 40 of sensor device 3 in a method step S2 by depositing or isolating metallic layers and passivation layers.

At least one second stopper element 52 is formed on a surface section 4 of integrated circuit 22 by depositing or isolating metallic layers and passivation layers.

MEMS structure 21 is connected to integrated circuit 22 by a bonding process in a method step S3. MEMS structure 21 and integrated circuit 22 are positioned with respect to one another in such a way that sensor device 3 may oscillate relative to surface section 4 of integrated circuit 22. After MEMS structure 21 is connected to integrated circuit 22, a first stopper element 51 and a second stopper element 52 are situated opposite one another along the normal direction. A deflection of sensor device 3 in the direction of surface section 4 is thus limited by stopper elements 51, 52.

The various layer structures may be provided using known deposition processes and etching processes, so that a detailed description may be dispensed with here.

What is claimed is:

1. A micromechanical device, comprising
a carrier substrate;
a sensor device situated on the carrier substrate and spaced apart from a surface section of the carrier substrate with spring elements so that the sensor device is oscillatable relative to the surface section; and
at least one stopper element, situated on the sensor device and/or on the surface section of the carrier substrate, which limits a deflection of the sensor device in a direction of the surface section,
wherein the at least one stopper element includes a first stopper element and a second stopper element, wherein the first stopper element includes a first electrical line, and the second stopper element includes a second electrical line,
wherein a hardness of an impact surface of the first stopper element differs from a hardness of an impact surface of the second stopper element,
wherein the first stopper element is situated on the sensor device, and the second stopper element is situated on the surface section, so that the sensor device may be deflected only until the first stopper element touches the second stopper element.

2. The device of claim 1, wherein the carrier substrate includes an integrated circuit that includes the surface section, and a MEMS structure at or on which the integrated circuit is situated, the sensor device being situated in a recess of the MEMS structure and connected to the MEMS structure via the spring elements.

3. The device of claim 1, wherein the sensor device includes a cavity, and a diaphragm that spans the cavity, and wherein the sensor device includes a pressure sensor.

4. A micromechanical device, comprising
a carrier substrate;
a sensor device situated on the carrier substrate and spaced apart from a surface section of the carrier substrate with spring elements so that the sensor device is oscillatable relative to the surface section; and
at least one stopper element, situated on the sensor device and/or on the surface section of the carrier substrate, which limits a deflection of the sensor device in a direction of the surface section,
wherein the at least one stopper element includes a first stopper element and a second stopper element, wherein the first stopper element includes a first electrical line, and the second stopper element includes a second electrical line, further comprising:
an evaluation device to measure a capacitance between the first electrical line and the second electrical line, and to determine a level of moisture in the area between the sensor device and the surface section, taking the measured capacitance into account.

5. The device of claim 4, wherein a first reference electrode is situated on the surface section, and a second reference electrode is situated on a region of the carrier substrate that is spaced apart from the surface section and adjacent to the sensor device, and wherein a distance between the region and the surface section is fixed, and wherein the evaluation device is also configured to measure a reference capacitance between the first and second reference electrodes, and to also determine the moisture, taking the reference capacitance into account.

6. The device of claim 4, wherein the evaluation device is configured to measure a resonant frequency of an oscillation of the sensor device relative to the surface section and to determine the moisture, taking the resonant frequency into account.

7. The device of claim 4, wherein a hardness of an impact surface of the first stopper element differs from a hardness of an impact surface of the second stopper element.

8. The device of claim 4, wherein the evaluation device is also configured to measure an ambient pressure and/or an acceleration of the sensor device, based on a measuring signal of the sensor device and taking the ascertained moisture into account.

9. A method for manufacturing a micromechanical device, the method comprising:
providing an integrated circuit and a MEMS structure, the MEMS structure including a sensor device that is oscillatable with spring elements;
forming at least one stopper element that is situated on the sensor device and/or on a surface section of the integrated circuit;
connecting the MEMS structure to the integrated circuit so that the sensor device is oscillatable relative to the surface section of the integrated circuit, a deflection of the sensor device in the direction of the surface section being limited by the at least one stopper element,
wherein the at least one stopper element includes at least one electrical line; and
measuring a resonant frequency of an oscillation of the sensor device relative to the surface section, and determining a level of moisture in an area between the sensor device and the surface section, taking the resonant frequency into account.

\* \* \* \* \*